United States Patent
Lin et al.

(10) Patent No.: US 6,441,465 B2
(45) Date of Patent: *Aug. 27, 2002

(54) SCRIBE LINE STRUCTURE FOR PREVENTING FROM DAMAGES THEREOF INDUCED DURING FABRICATION

(75) Inventors: Chi-Fa Lin; Wei-Tsu Tseng; Min-Shinn Feng, all of Hsinchu (TW)

(73) Assignee: Winbond Electronics Corp., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,924

(22) Filed: Feb. 9, 1999

(51) Int. Cl.[7] .............................................. H01L 23/544
(52) U.S. Cl. ....................................................... 257/620
(58) Field of Search .................................. 257/620, 638, 257/758, 797; 438/113, 458, 462

(56) References Cited

U.S. PATENT DOCUMENTS

| 5,300,816 A | 4/1994 | Lee et al. |
| 5,414,297 A | 5/1995 | Morita et al. |
| 6,025,639 A | * 2/2000 | Mitwalsky et al. ......... 257/620 |

FOREIGN PATENT DOCUMENTS

JP    4-116848    * 4/1992

* cited by examiner

Primary Examiner—Tom Thomas
Assistant Examiner—Thien F Tran
(74) Attorney, Agent, or Firm—Birch, Stewart, Kolasch & Birch, LLP

(57) ABSTRACT

A scribe line structure of a semiconductor wafer is provided in the invention. The semiconductor wafer has a plurality of substantially parallel horizontal scribe lines and a plurality of substantially parallel vertical scribe lines to separate a plurality of chips from each other. According to the invention, each parallel horizontal scribe line and each parallel vertical scribe line are divided along two elongated sides thereof into a plurality of portions with the same rectangular area. Each of the plurality of portions of each scribe line is composed of the scribe line structure. The scribe line structure comprises a multi-layer structure with four sides formed over whole area of each portion of each scribe line and at least two rows of cavities formed along the four sides of the multi-layer structure. The cavities of the scribe line structure are capable of relieving internal stress of the scribe lines and arresting possible cracks induced during scribe line manufacture. Thereby, peeling, delamination and dielectric fracture of the scribe lines induced during the wafer manufacture can be prevented.

4 Claims, 5 Drawing Sheets

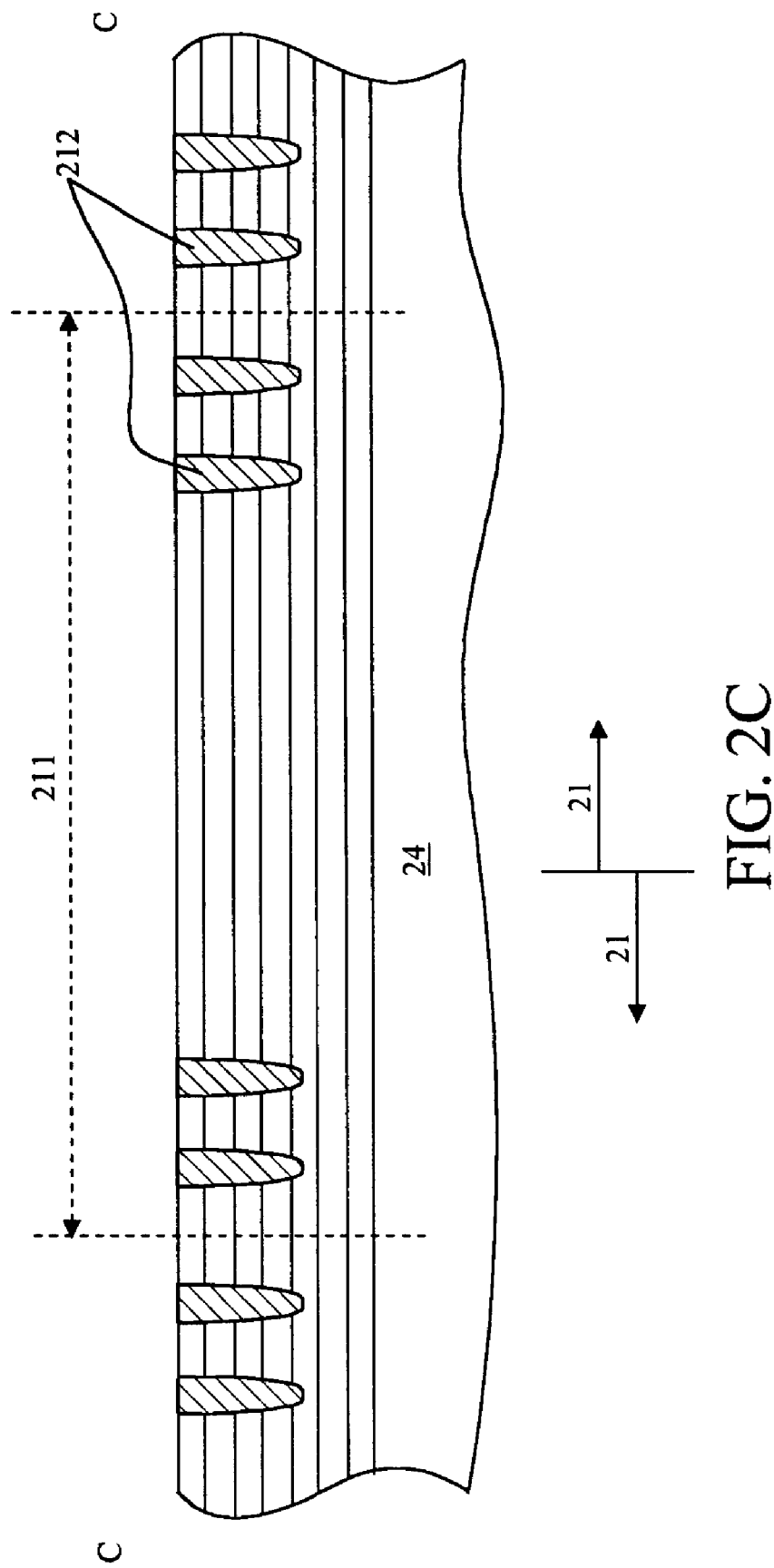

SCRIBE LINE STRUCTURE FOR PREVENTING FROM DAMAGES THEREOF INDUCED DURING FABRICATION

FIELD OF INVENTION

The invention relates to a scribe line structure of a semiconductor wafer, and in particular, to a scribe line structure with the capability of relieving internal stress and arresting cracks induced during scribe line fabrication for preventing from damages thereof.

BACKGROUND OF INVENTION

Referring to FIG. 1A, in a semiconductor wafer 10, a plurality of substantially parallel horizontal scribe lines 11 and a plurality of substantially vertical scribe lines 11 are always formed over a substrate 14 of the wafer 10 for separating a plurality of chips 13 from each other. In general, the scribe lines are composed of a multi-layer structure without pattern about 100 μm in width depending on the dimension of chips manufactured in wafer. After being manufactured, a wafer is divided into a plurality of dies by sawing the wafer along the scribe lines thereof. In addition, to prevent cracks induced during wafer sawing operation from propagating into chips, each of a plurality of chips is usually surrounded by a corresponding blank space about 3~10 μm in width, namely seal ring. That is, as shown in FIG. 1A, a corresponding seal ring 12 is usually formed between a chip 13 and a scribe line 11 adjacent to the chip 13. Nevertheless, during wafer manufacture, some possible damages are introduced into the scribe lines, and further attack the seal rings and chips adjacent to the damaged scribe lines, e.g., peeling, delamination and dielectric fracture. The cause of possible damages of the scribe lines induced during wafer manufacture will be explained as follows.

As mentioned above, a scribe line is composed of a multi-layer structure simply. Moreover, the multi-layer structure generally includes a plurality of conductive layers and insulating layers, and the plurality of conductive and insulating layers are formed over areas of the scribe lines while the conductive and insulating layers are being formed for fabricating the chips. It is noted that profile of each scribe line is like a wide string, i.e., each scribe line has two elongated sides. Consequently, one layer, deposited over the areas of the scribe lines to provide the multi-layer structure, will generate more or less shrinkage along two elongated sides of each scribe line at post deposition cool down step thereof. A large dimension of shrinkage of a layer in the multi-layer structure is significant when the layer is composed of a metal material, especially for metal material with high thermal extension coefficient, such as aluminum. Significant shrinkage of a layer in the multi-layer structure will introduce high level of internal stress into the scribe lines. Thereafter, the scribe lines thereof will suffer from damages induced by high level of internal stress, such as peeling, delamination and dielectric fracture. The damages of the scribe lines mentioned above are usually observed when the multi-layer structure includes an intermetal dielectric layer which is composed of an upper $SiO_2$ layer, an SOG (spin-on glass) layer, and a lower $SiO_2$ layer. Nevertheless, the intermetal dielectric layer is usually employed in IC manufacture.

As shown in FIG. 1B, the multi-layer structure of the scribe line 11 includes a metal layer 111 and an intermetal dielectric layer 112 composed of a $SiO_2$ layer 1121, an SOG layer 1122, and a $SiO_2$ layer 1123. The metal layer 111 and the intermetal dielectric layer 112 are formed over the areas of the scribe lines 11 while they are being formed in a metallization process of the chips 13. The metal layer 111 is formed after the formation of the intermetal dielectric layer 112. Thus, high level of inter-layer stress induced by shrinkage of the metal layer 111 between the metal layer 111 and the intermetal dielectric layer is difficult to coordinate. To coordinate the high level of inter-layer stress, delamination 113 of the metal layer 111 will occur, and even induce peeling 114 of the scribe lines 11, as illustrated in FIG. 1B. Moreover, high internal stress of brittle dielectric layers also induces fracture thereof Especially for the intermetal dielectric layer 112, due to poor adhesion between the $SiO_2$ layer 1221 and the SOG layer 1223, dielectric fracture 115 easily initiates at the $SiO_2$/SOG interface nearing the edge of the scribe lines, as illustrated in FIG. 1B.

The following prior art references relate to the improvement technology for scribe lines of a wafer.
1. U.S. Pat. No. 5,686,171
2. U.S. Pat. No. 5,414,297
3. U.S. Pat. No. 5,300,816
4. U.S. Pat. No. 5,237,199
5. U.S. Pat. No. 5,136,354

However, the prior arts only focus on the improvement of step coverage or interlayer adhesion of scribe lines of a wafer. The damages of scribe lines induced by high internal stress are not solved in the prior arts.

Accordingly, an objective of the invention is to provide a scribe line structure for preventing from possible damages induced during scribe line manufacture.

SUMMARY OF INVENTION

An objective of the invention is provided a scribe line structure for preventing from possible damages induced during scribe line manufacture, such as peeling, delamination, and dielectric fracture.

According to the invention, in a semiconductor wafer with a plurality of substantially parallel horizontal scribe lines and a plurality of substantially parallel vertical scribe lines separating a plurality of chips from each other, each parallel horizontal scribe line and each parallel vertical scribe line are divided along two elongated sides thereof into a plurality of portions with the same rectangular area. Each of the plurality of portions of each scribe line is composed of the scribe line structure. The scribe line structure includes a multi-layer structure with four sides formed over whole area of each portion of each scribe line and at least two rows of cavities formed along the four sides of the multi-layer structure.

The cavities of the scribe line structure are capable of relieving internal stress of scribe lines and arresting possible cracks induced during scribe line manufacture. Thereby, peeling and delamination of the scribe lines during scribe line manufacture can be prevented.

BRIEF DESCRIPTION OF THE APPENDED DRAWINGS

FIG. 2B and FIG. 2C are section views showing the scribe line structure of FIG. 2A along B—B line and C—C line, respectively.

DETAILED DESCRIPTION OF THE INVENTION

An objective of the invention is provided a scribe line structure for preventing from possible damages induced during scribe line fabrication, such as peeling, delamination, and dielectric fracture. As explained previously, the damages of scribe lines are mainly resulted from a large dimension of shrinkage of a layer in the multilayer structure of the scribe lines at post deposition cool down step of the layer.

It is obvious that a scribe line is a string-like continuum. On concept of fracture mechanics, when a discontinuous structure, such as a hole or a cavity, is introduced into a continuum and located in the propagation way of a crack occurring in the continuum, the discontinuous structure is capable of intercepting the continuity of the continuum and arresting the crack. In this case, the propagation energy of the arrested crack is reduced significantly, even eliminated, by the discontinuous structure. Utilizing the phenomena mentioned above, the present invention provides a discontinuous scribe line structure in which discontinuous structures, cavities, are employed. In the same manner, the cavities of the scribe line structure are capable of intercepting the continuity of the string-like scribe line and arresting possible cracks induced during scribe line fabrication. The interception of the continuity of the scribe line will prevent from a large dimension of shrinkage of a layer in the multi-layer structure of the scribe line and relieve the internal stress of the scribe line. By the capability of crack-arresting and stress-relieving, the cavities can prevent from damages of the scribe lines induced during scribe line fabrication effectively.

Figure 1A:
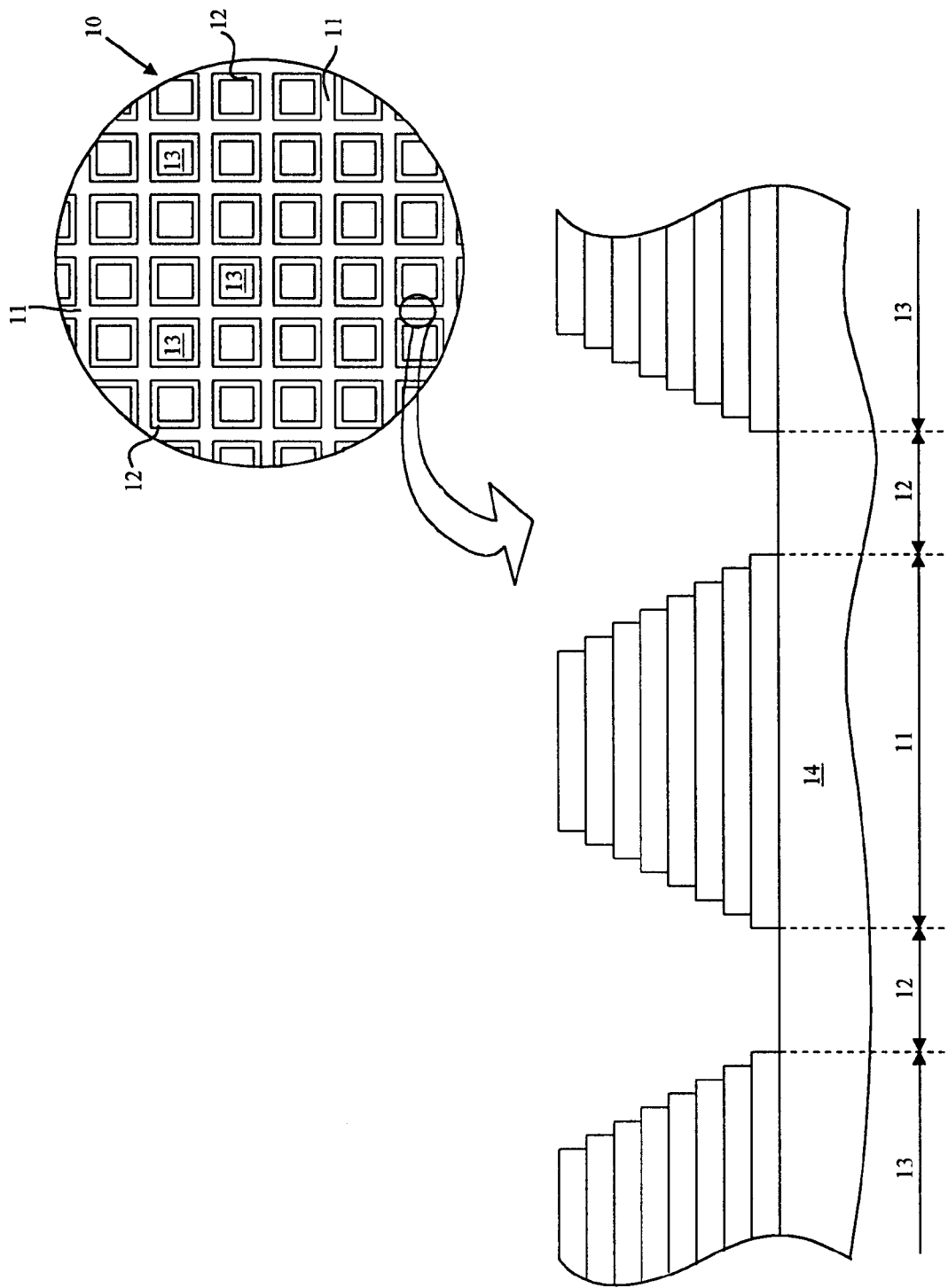
FIG. 1A is a diagram illustrating the scribe lines of a wafer fabricated by a prior art.
Figure 1B:
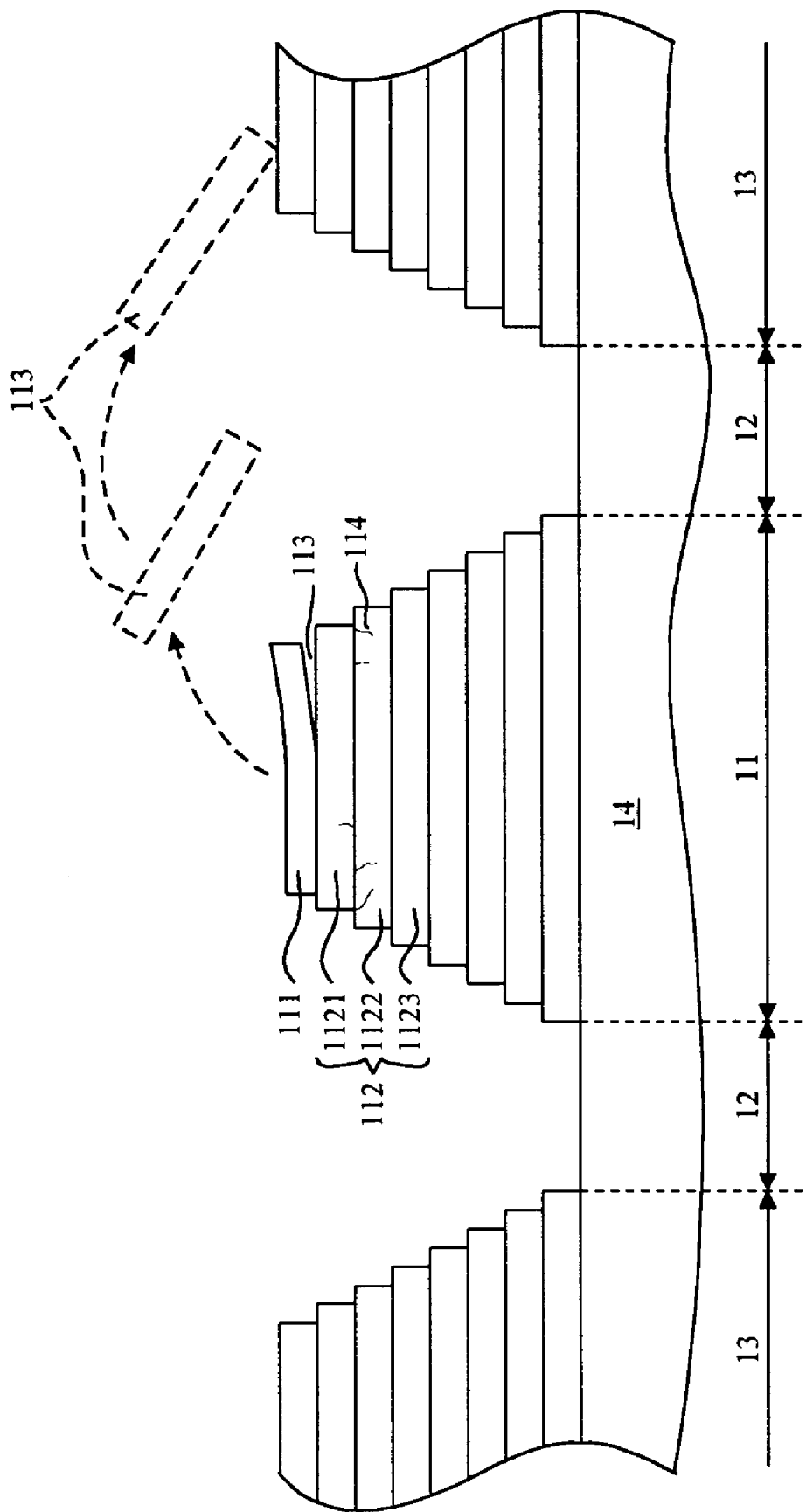
FIG. 1B is a diagram illustrating possible damages of the scribe lines in FIG. 1A induced during scribe line manufacture.
Figure 2A:
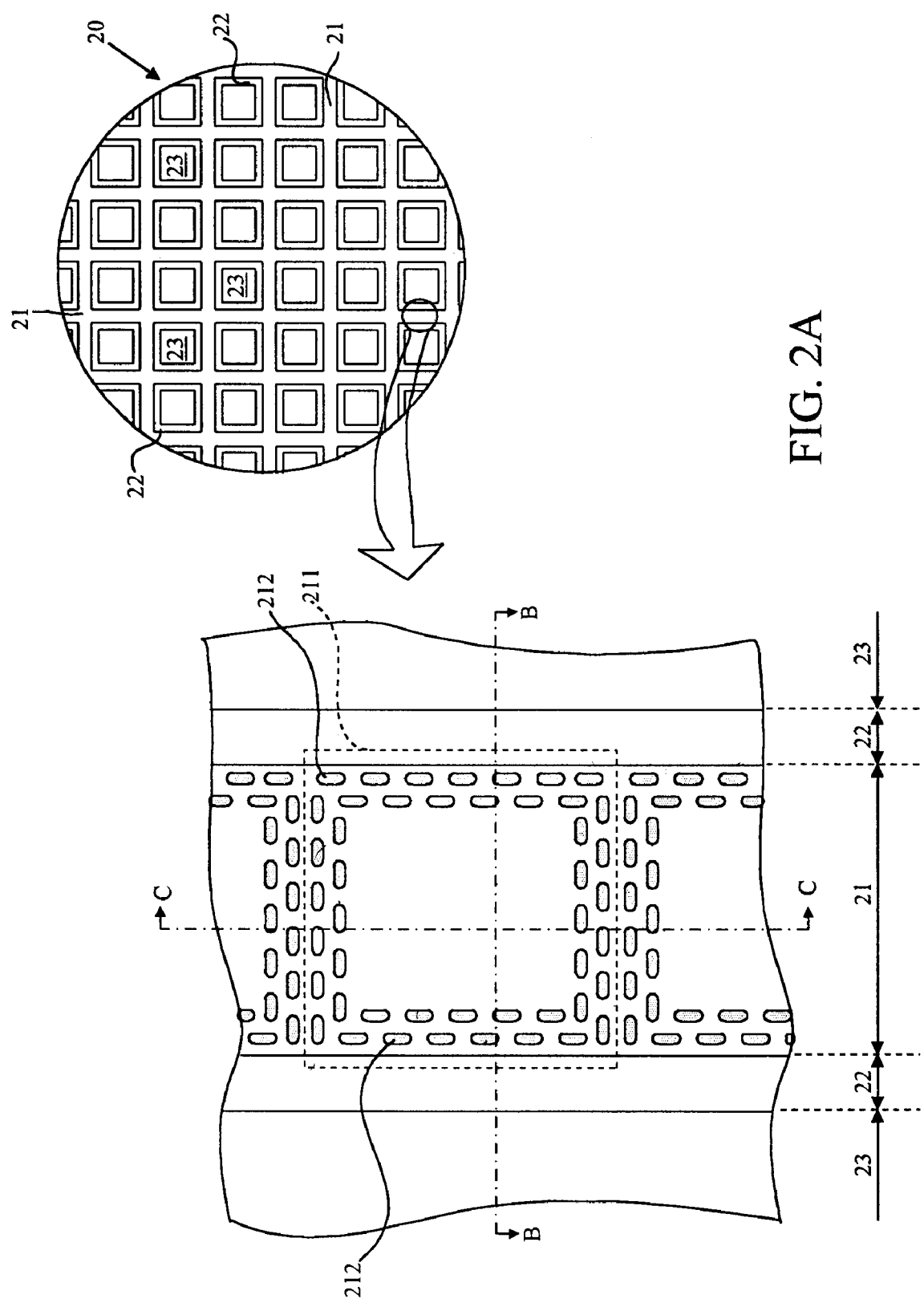
FIG. 2A is a top view of the scribe line structure in accordance with an embodiment of the invention.
Figure 2B:
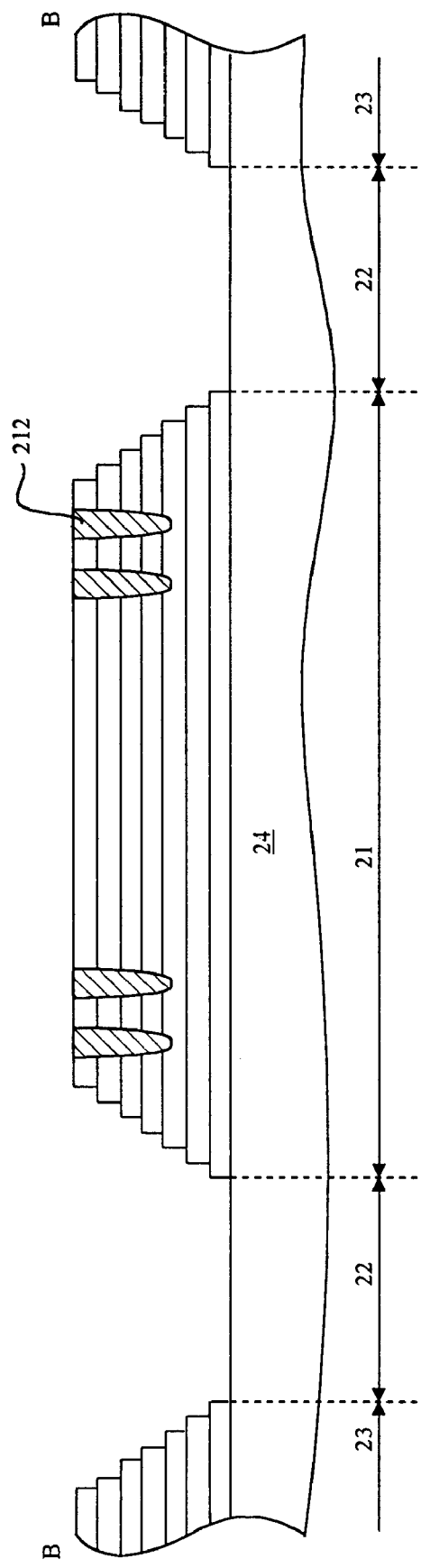

Referring to FIGS. 2, an embodiment according to the invention is revealed. FIG. 2A is a top view of the scribe line structure in accordance with the embodiment of the invention. FIG. 2B and FIG. 2C are section views showing the scribe line structure along B—B line and C—C line in FIG. 2A, respectively. As shown in FIG. 2A, in a semiconductor wafer 20, a plurality of substantially parallel horizontal scribe lines 21 and a plurality of substantially parallel vertical scribe lines 21 are formed over a substrate 24 of the wafer 20 for separating a plurality of chips 23 from each other. One corresponding seal ring 22 is formed between each of the plurality of scribe lines 21 and each of two adjacent chips 23 for preventing the chips 23. Each of the plurality of parallel horizontal scribe lines 21 and each of the plurality of parallel vertical scribe lines 21 all have two elongated sides and are divided along the elongated sides into a plurality of portions with the same rectangular area. Each of the plurality of portions of each scribe line is composed of the scribe line structure. The scribe line structure includes a multi-layer structure 211 and at least of two rows of cavities 212. The multi-layer structure 211 defines four sides and is formed over whole area of each portion of each scribe line 21. The two rows of cavities 212 are formed along the four sides of the multi-layer structure 211. With the formation of the cavities, each portion of each scribe line 21 is separated from adjacent portions, i.e., each portion of each scribe line is discontinuous with adjacent portions thereof. With suitable arrangement, the cavities 212 of the scribe line structure can arrest all possible cracks induced during scribe line fabrication. It is noted that the cavities cannot have sharp corners such that secondary cracks are possibly induced by stress concentration of sharp structures. As shown in FIG. 2A, the top view of each cavity 212 is a rectangle with rounded corners. In another embodiment, the top view of each cavity can be another pattern with rounded corners, such as circle or triangle. The multi-layer structure of the scribe line structure of the invention includes a plurality of conductive layers and a plurality of insulating layers. Furthermore, to decrease probability of large dimension of shrinkage of the multi-layer structure, the plurality of conductive layers are not selected from the group consisting of metal materials. Moreover, to decrease probability of dielectric fracture of the multi-layer structure, the plurality of insulating layers are not selected from the group consisting of materials with poor adhesion, such as SOG materials.

In addition, the fabrication of the scribe line structure of the invention is a convenient process. This cannot increase complexity of whole fabrication of the semiconductor wafer. A mentioned above, according to the invention, the multi-layer structure of the scribe line structure is formed over area of each portion of each scribe line and each of the cavities of the scribe line structure defines a corresponding bottom surface. By a specific mask according to the scribe line structure, while being formed to fabricate the plurality of chips, the conductive layers are formed over whole area of each portion of each scribe line rather than all bottom surfaces to provide the multi-layer structure and said cavities. Moreover, while being formed to fabricate the plurality of chips, the insulating layers are formed over whole area of each portion of each scribe line rather than all bottom surfaces to provide the multi-layer structure and said cavities. Consequently, the fabrication of the scribe line structure according to the invention is a convenient process.

What is claimed is:

1. A scribe line structure of a semiconductor wafer, said semiconductor wafer having a plurality of substantially parallel horizontal scribe lines and a plurality of substantially parallel vertical scribe lines separating a plurality of chips from each other, each parallel horizontal scribe line and each parallel vertical scribe line having two elongated sides and being divided along the elongated sides into a plurality of portions with the same rectangular area, each of the plurality of portions of each scribe line being composed of said scribe line structure, said scribe line structure comprising:

a multi-layer structure formed over whole area of each portion of each scribe line, said multi-layer structure defining four sides; and at least two rows of cavities formed along the four sides of said multi-layer structure;

wherein said cavities are capable of relieving internal stress of the scribe lines and arresting possible cracks induced during scribe line manufacture to prevent from damages of the scribe lines.

2. The scribe line structure of claim 1, wherein each of said cavities has rounded corners for reducing stress concentration thereof.

3. The scribe line structure of claim 1, wherein said multi-layer structure comprises a plurality of conductive layers and a plurality of insulating layers disposed over a substrate of said semiconductor wafer.

4. The scribe line structure of claim 3, wherein said substrate is a silicon substrate, said conductive layers are selected from the group consisting of polycrystalline semiconductor materials and silicides, and said insulating layers are selected from the group consisting of oxides, nitrides, and BPSG (boron-phosphorous silicon glass) materials.

* * * * *